US010784131B2

(12) United States Patent
Woo

(10) Patent No.: US 10,784,131 B2
(45) Date of Patent: Sep. 22, 2020

(54) EFEM, EQUIPMENT FRONT END MODULE

(71) Applicant: Bum Je Woo, Seongnam (KR)

(72) Inventor: Bum Je Woo, Seongnam (KR)

( * ) Notice: Subject to any disclaimer, the term of this patent is extended or adjusted under 35 U.S.C. 154(b) by 55 days.

(21) Appl. No.: 15/976,738

(22) Filed: May 10, 2018

(65) Prior Publication Data
US 2019/0304819 A1 Oct. 3, 2019

(30) Foreign Application Priority Data

Apr. 3, 2018 (KR) .................. 10-2018-0038675

(51) Int. Cl.
*H01L 21/67* (2006.01)
*H01L 21/677* (2006.01)
*B65G 69/20* (2006.01)

(52) U.S. Cl.
CPC ....... *H01L 21/67196* (2013.01); *B65G 69/20* (2013.01); *H01L 21/67167* (2013.01); *H01L 21/67184* (2013.01); *H01L 21/67766* (2013.01); *H01L 21/67778* (2013.01); *B65G 2201/0297* (2013.01); *H01L 21/67769* (2013.01)

(58) Field of Classification Search
CPC ......... H01L 21/67196; H01L 21/67167; H01L 21/67184; H01L 21/67766; H01L 21/6778; H01L 21/67769; B65G 69/20; B65G 2201/0297
USPC .......................................... 141/98
See application file for complete search history.

(56) References Cited

U.S. PATENT DOCUMENTS

| | | | | | |
|---|---|---|---|---|---|
| 2,912,918 A | * | 11/1959 | Mead | ...................... | B24C 9/003 454/66 |
| 2,994,259 A | * | 8/1961 | O'Day | .................. | F24F 13/062 454/300 |
| 3,273,323 A | * | 9/1966 | Whitfield | .............. | B08B 15/023 55/385.2 |
| 3,631,788 A | * | 1/1972 | Larkfeldt | .............. | F24F 13/068 454/297 |
| 3,657,991 A | * | 4/1972 | Oberg | ....................... | F24F 7/10 454/49 |
| 3,726,204 A | * | 4/1973 | Lindestrom | ............... | F24F 7/10 454/189 |
| 3,776,121 A | * | 12/1973 | Truhan | .................... | F24F 3/044 454/187 |
| 3,776,358 A | * | 12/1973 | Williams | ........... | B60H 1/00378 180/84 |
| 3,895,570 A | * | 7/1975 | Eagleson, Jr. | .......... | B08B 15/02 454/57 |
| 3,923,482 A | * | 12/1975 | Knab | ................... | A61G 13/108 55/412 |
| 3,998,142 A | * | 12/1976 | Foreman | ............. | A61G 13/108 454/187 |
| 4,098,174 A | * | 7/1978 | Landy | .................. | B08B 15/023 454/57 |

(Continued)

FOREIGN PATENT DOCUMENTS

JP 2003007799 A * 1/2003
JP 2008296069 A 12/2008

(Continued)

*Primary Examiner* — Timothy L Maust
*Assistant Examiner* — James R Hakomaki

(57) ABSTRACT

Disclosed is an equipment front end module (EFEM) in which wafer transfer is conducted between a wafer storage device where a wafer is stored and a process chamber. In addition, the EFEM generates gas flow in a wafer transfer chamber.

1 Claim, 17 Drawing Sheets

(56) References Cited

U.S. PATENT DOCUMENTS

| | | | | |
|---|---|---|---|---|
| 4,660,464 A * | 4/1987 | Tanaka | ............... | F24F 3/161 |
| | | | | 104/139 |
| 4,723,480 A * | 2/1988 | Yagi | ............... | F24F 3/1607 |
| | | | | 454/187 |
| 5,303,482 A * | 4/1994 | Yamashita | ....... | H01L 21/67769 |
| | | | | 34/218 |
| 5,363,867 A * | 11/1994 | Kawano | ............... | B08B 9/093 |
| | | | | 134/95.2 |
| 5,711,705 A * | 1/1998 | Krainiak | ............... | A61L 2/208 |
| | | | | 454/57 |
| 5,792,259 A * | 8/1998 | Yoshioka | ............... | B05C 15/00 |
| | | | | 118/52 |
| 5,830,058 A * | 11/1998 | Rosjo | ............... | A61G 13/108 |
| | | | | 454/187 |
| 5,876,280 A * | 3/1999 | Kitano | ............... | G03F 7/7075 |
| | | | | 454/187 |
| 6,010,400 A * | 1/2000 | Krainiak | ............... | A61L 2/208 |
| | | | | 454/187 |
| 6,080,060 A * | 6/2000 | Larsson | ............... | F24F 3/161 |
| | | | | 454/187 |
| 6,224,679 B1 * | 5/2001 | Sasaki | ............... | B08B 5/00 |
| | | | | 118/719 |
| 6,884,158 B1 * | 4/2005 | Blomqvist | ............ | A61G 13/108 |
| | | | | 454/189 |
| 7,204,751 B2 * | 4/2007 | Jang | ............... | B01D 53/0446 |
| | | | | 454/187 |
| 8,915,984 B2 * | 12/2014 | Kawasaki | ............... | B01L 1/04 |
| | | | | 312/1 |
| 9,704,727 B2 * | 7/2017 | Segawa | ............ | H01L 21/67017 |
| 10,337,751 B2 * | 7/2019 | Lieberman | ............... | B08B 15/02 |
| 2005/0160705 A1 * | 7/2005 | Bernard | ............ | H01L 21/67017 |
| | | | | 55/385.1 |
| 2017/0170033 A1 * | 6/2017 | Okabe | ............... | H01L 21/67393 |
| 2018/0040493 A1 * | 2/2018 | Kawai | ............... | B01D 53/04 |
| 2018/0286715 A1 * | 10/2018 | Sakurabayashi | ....... | B01D 53/04 |

FOREIGN PATENT DOCUMENTS

| | | |
|---|---|---|
| KR | 100490238 B1 | 9/2005 |
| KR | 10-1002949 B1 | 12/2010 |
| KR | 10-2015-0009421 A | 1/2015 |

* cited by examiner

EFEM, EQUIPMENT FRONT END MODULE

CROSS REFERENCE TO RELATED APPLICATION

The present application claims priority to Korean Patent Application No. 10-2018-0038675, filed Apr. 3, 2018, the entire contents of which is incorporated herein for all purposes by this reference.

BACKGROUND OF THE INVENTION

Field of the Invention

The present invention relates generally to an equipment front end module (EFEM) in which wafer transfer is conducted between a wafer storage device where a wafer is stored and a process chamber.

Description of the Related Art

In a semiconductor manufacturing process, wafers are processed in a clean room to improve yield and quality. However, as devices are highly integrated and circuits are miniaturized along with the adoption of larger wafers, it has become difficult to manage an entire clean room with respect to technique and cost.

Thus, a surrounding of wafers has been managed with respect to cleanness in recent years. Accordingly, a module known as an equipment front end module (EFEM) has been adopted for storing wafers in a closed storage pod known as a front-opening unified pod (FOUP) and for transferring the wafers between process equipment for wafers and the FOUP.

The EFEM is configured with a wafer transfer chamber provided with a wafer transfer device such that a side surface of the wafer transfer chamber is connected to a load port where the FOUP is coupled and an opposite side surface of the wafer transfer chamber is connected to process equipment. Accordingly, the wafer transfer device transfers wafers stored in the FOUP to the process equipment and transfers the wafers having been processed in the process equipment into a wafer storage device.

Korean Patent No. 10-1002949, which is referred to as "Patent Document 1" hereinafter, and Korean Patent Application Publication No. 10-2015-0009421, which is referred to as "Patent Document 2" hereinafter, disclose the EFEM described above.

EFEMs disclosed in Patent Documents 1 and 2 are configured such that when wafers stored in a FOUP coupled to a load port are transferred by a robot arm in a wafer transfer chamber, gases are supplied into the wafer transfer chamber, whereby cleanliness in the wafer transfer chamber is managed.

However, only one delivery unit for delivering gas is provided in the cases of Patent Documents 1 and 2. Thus, when wafers are introduced in the wafer transfer chamber, water particles, dust, gas, etc. may follow such that a contaminant degree in the wafer transfer chamber may be increased, and particles generated inside the wafer transfer chamber may adhere to inner surfaces of the wafer transfer chamber such that an inside of the wafer transfer chamber may be corroded or damaged.

DOCUMENTS OF RELATED ART (Patent Document 1) Korean Patent No. 10-1002949; and
(Patent Document 2) Korean Patent Application Publication No. 10-2015-0009421.

SUMMARY OF THE INVENTION

Accordingly, the present invention has been made keeping in mind the above problems occurring in the related art, and the present invention is intended to propose an equipment front end module (EFEM) being capable of controlling gas supply to a wafer transfer chamber, thus preventing contamination in the wafer transfer chamber.

In order to achieve the above object, according to one aspect of the present invention, there is provided an equipment front end module (EFEM), the EFEM including: a wafer transfer chamber in which wafer transfer is conducted between a wafer storage device and a process chamber; a delivery unit disposed on the wafer transfer chamber and delivering gas into the wafer transfer chamber; and an exhaust unit disposed under the wafer transfer chamber and exhausting the gas from the wafer transfer chamber, wherein the delivery unit is divided into a center delivery region and a peripheral delivery region that is provided around the center delivery region.

In addition, the exhaust unit may be divided into a center exhaust unit and a peripheral exhaust unit provided around the center exhaust unit, and the center delivery region and the peripheral delivery region may be disposed at positions corresponding to the center exhaust unit and the peripheral exhaust unit respectively.

In addition, the center delivery region and the peripheral delivery region may independently exhaust gas from the wafer transfer chamber.

In addition, the center exhaust unit and the peripheral exhaust unit may independently exhaust gas from the wafer transfer chamber.

An equipment front end module (EFEM) includes: a wafer transfer chamber in which wafer transfer is conducted between a wafer storage device and a process chamber; a delivery unit disposed on the wafer transfer chamber and delivering gas into the wafer transfer chamber; and an exhaust unit disposed under the wafer transfer chamber and exhausting the gas from the wafer transfer chamber, wherein the delivery unit is divided into a center delivery region and a peripheral delivery region that is provided around the center delivery region, the exhaust unit is divided into a center exhaust unit and a peripheral exhaust unit provided around the center exhaust unit, and the center exhaust unit and the peripheral delivery region are communicated with each other by a return line whereby gas exhausted from the center exhaust unit is delivered to the wafer transfer chamber through the peripheral delivery region.

In addition, the center delivery region and the peripheral delivery region may be disposed at positions corresponding to the center exhaust unit and the peripheral exhaust unit respectively.

An equipment front end module (EFEM) includes: a wafer transfer chamber in which wafer transfer is conducted between a wafer storage device and a process chamber; a delivery unit disposed on the wafer transfer chamber and delivering gas into the wafer transfer chamber; and an exhaust unit disposed under the wafer transfer chamber and exhausting the gas from the wafer transfer chamber, wherein the delivery unit is provided with a plurality of supply modules, and the plurality of supply modules is controlled independently.

An equipment front end module (EFEM) includes: a wafer transfer chamber in which wafer transfer is conducted between a wafer storage device and a process chamber; a delivery unit disposed on the wafer transfer chamber and delivering gas into the wafer transfer chamber; and an exhaust unit disposed under the wafer transfer chamber and exhausting the gas from the wafer transfer chamber, wherein the exhaust unit is provided with a plurality of exhaust modules, and the plurality of exhaust modules is controlled independently.

An equipment front end module (EFEM) includes: a wafer transfer chamber in which wafer transfer is conducted between a wafer storage device and a process chamber; a delivery unit disposed on the wafer transfer chamber and delivering gas into the wafer transfer chamber; and an exhaust unit disposed under the wafer transfer chamber and exhausting the gas from the wafer transfer chamber, wherein the delivery unit is provided with a plurality of supply modules and the exhaust unit is provided with a plurality of exhaust modules, and the plurality of supply modules and the plurality of exhaust modules are controlled independently.

According to the EFEM of the present invention as described above, the following effects can be obtained.

Primary purification is implemented by an air screen generated by a peripheral delivery region, and secondary purification on an introduced wafer is implemented by a center delivery region, whereby desired cleanliness in a wafer transfer chamber can be maintained.

In addition, the air screen generated by the peripheral delivery region prevents particles generated inside the wafer transfer chamber during wafer transfer from adhering to wall surfaces of the wafer transfer chamber, whereby damage such as corrosion that may occur inside the wafer transfer chamber can be reduced.

In addition, gas delivered through the center delivery region is recycled and circulated through a return line and delivered to the peripheral delivery region whereby desired cleanliness in the wafer transfer chamber can be maintained and an amount of gas used for conventional EFEMs can be reduced.

Furthermore, a flow rate and flow velocity of gas supplied into the wafer transfer chamber can be controlled by independent controls of supply modules and exhaust modules, whereby various flows of gas supplied into the wafer transfer chamber can be generated.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Hereinafter, preferred embodiments of the present invention will be described in detail with reference to the accompanying drawings.

Contents of the description below merely exemplify the principle of the invention. Therefore, those of ordinary skill in the art may implement the theory of the invention and invent various apparatuses which are included within the concept and the scope of the invention even though it is not clearly explained or illustrated in the description. Furthermore, in principle, all the conditional terms and embodiments listed in this description are clearly intended for the purpose of understanding the concept of the invention, and one should understand that this invention is not limited to such specially listed exemplary embodiments and the conditions.

The above described objectives, features, and advantages will be more apparent through the following detailed description related to the accompanying drawings, and thus those of ordinary skill in the art may easily implement the technical spirit of the invention.

EFEM 10 According to a First Embodiment of the Present Invention

An EFEM 10 according to a first embodiment of the present invention will be described with reference to FIGS. 1 to 9.

Figure 1:
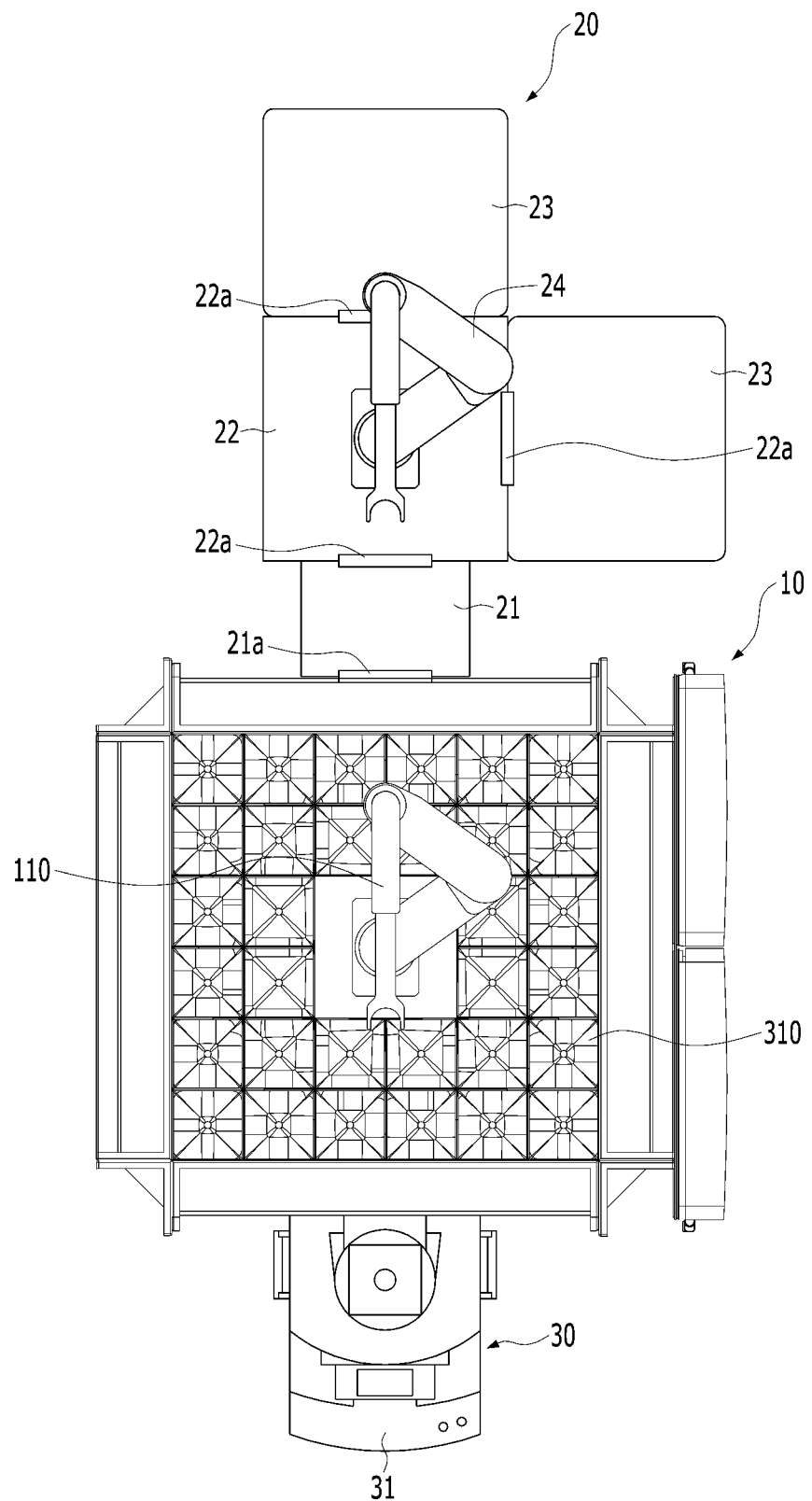
FIG. 1 is a plan view showing a process chamber connected to an EFEM according to a first embodiment of the present invention.
Figure 2:
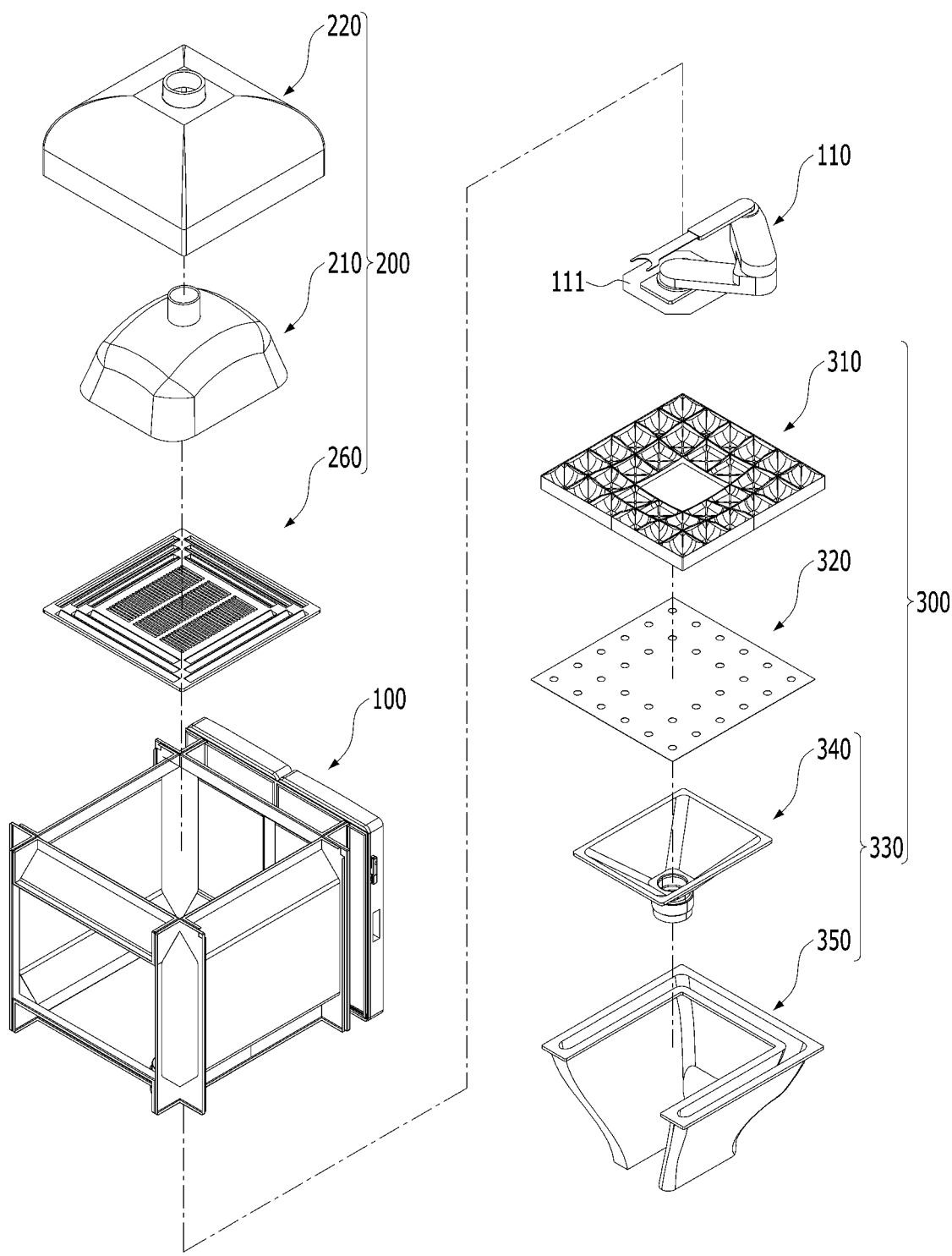
FIG. 2 is an exploded view showing the EFEM according to the first embodiment of the present invention.
Figure 3:
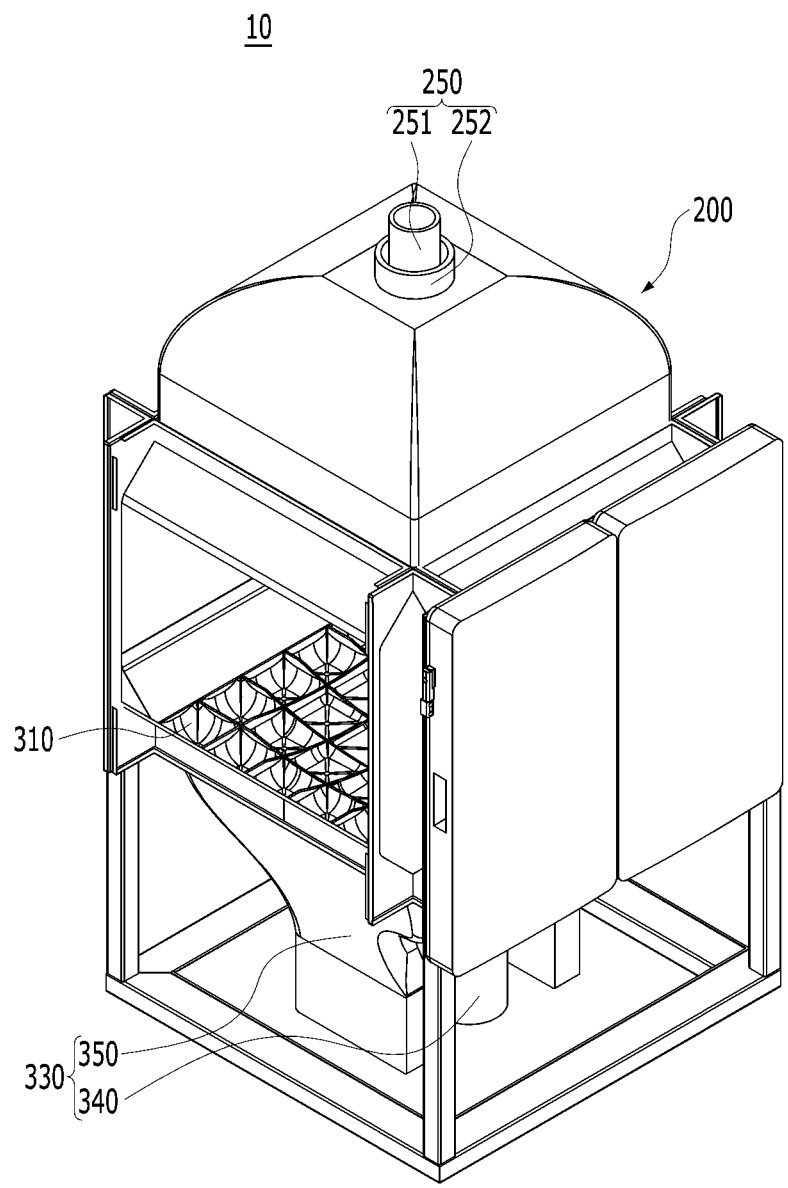
FIG. 3 is a perspective view showing the EFEM according to the first embodiment of the present invention.
Figure 4:
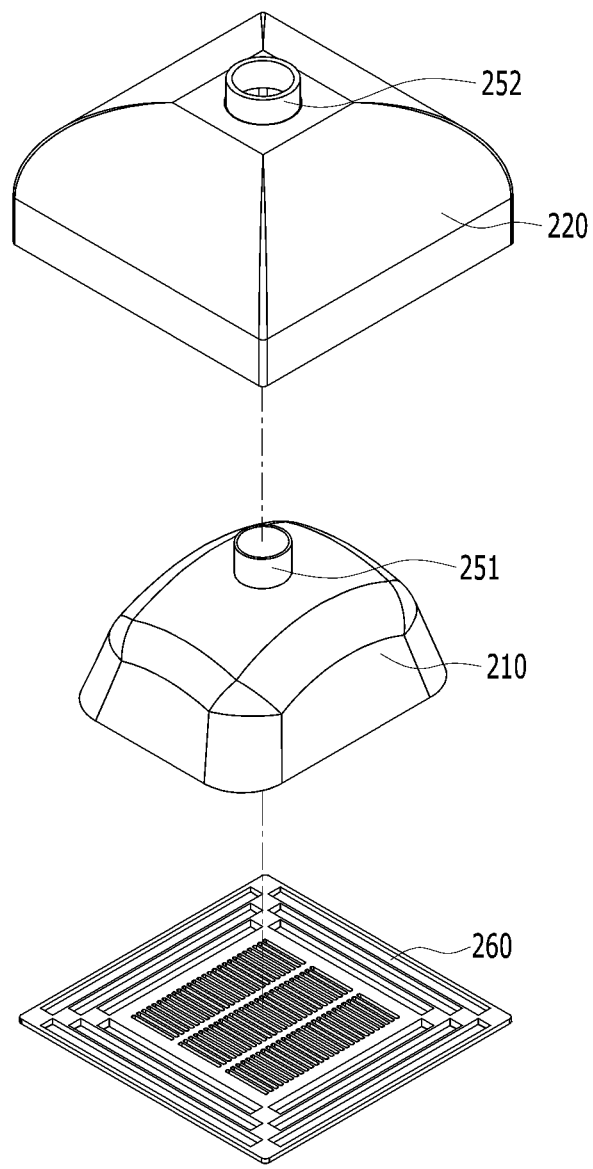
FIG. 4 is an exploded view showing a delivery unit of the EFEM according to the first embodiment of the present invention.
Figure 5A:
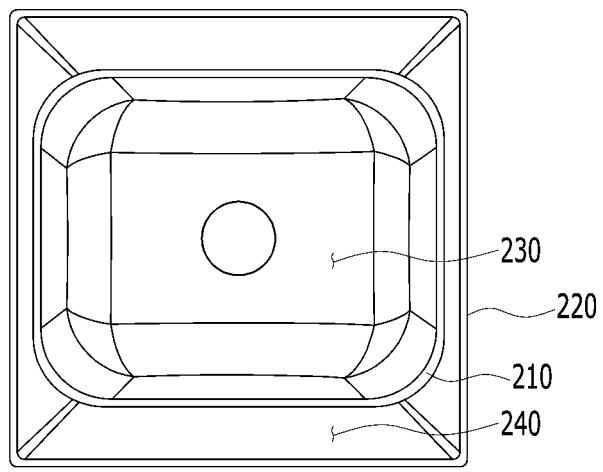
FIG. 5A is a top plan view showing the delivery unit of the EFEM according to the first embodiment of the present invention.
Figure 5B:
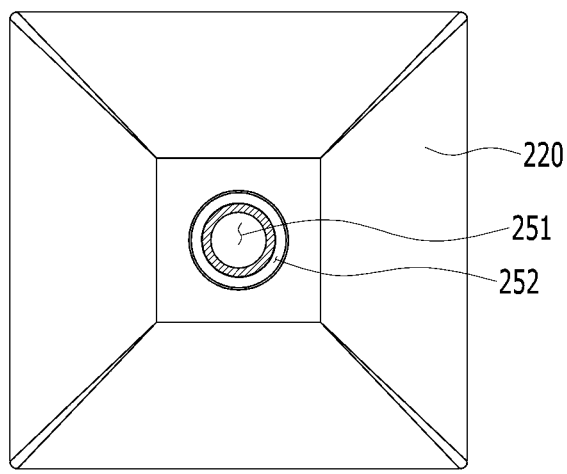
FIG. 5B is a bottom plan view showing the delivery unit of the EFEM according to the first embodiment of the present invention.
Figure 6:
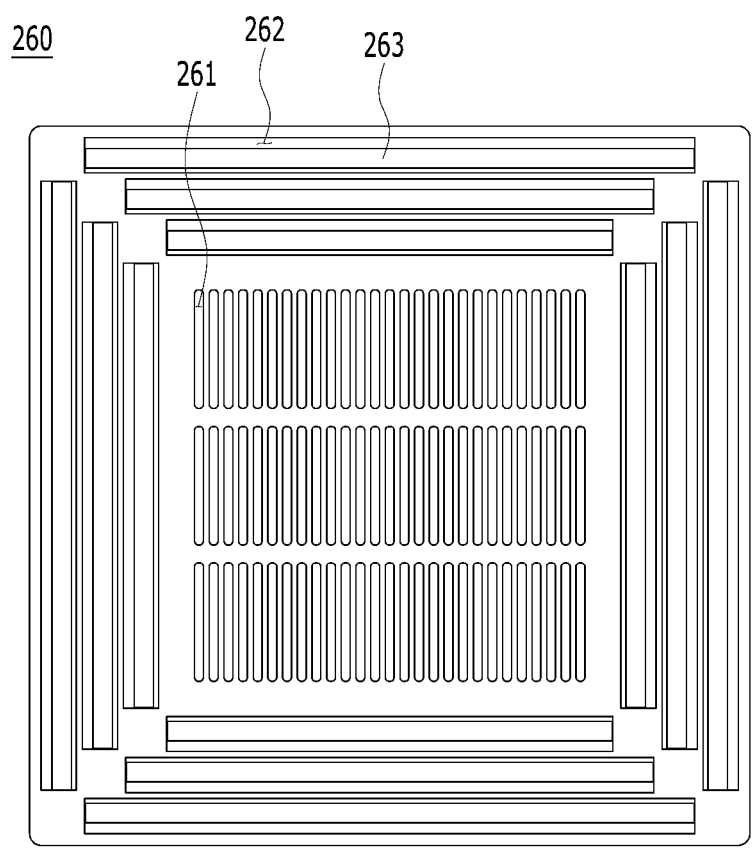
FIG. 6 is a plan view showing a flow control plate of the EFEM according to the first embodiment of the present invention.
Figure 7:
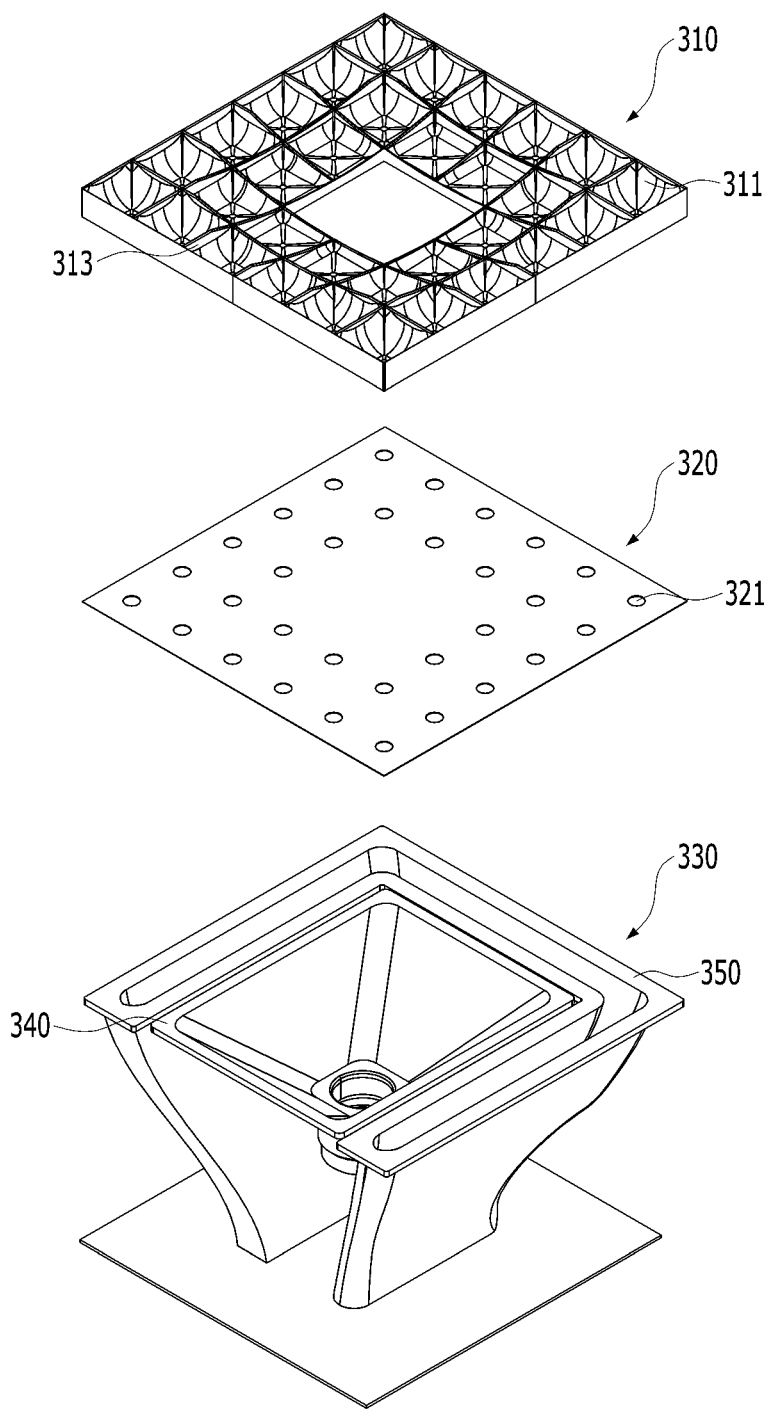
FIG. 7 is an exploded view showing an exhaust unit of the EFEM according to the first embodiment of the present invention.
Figure 8:
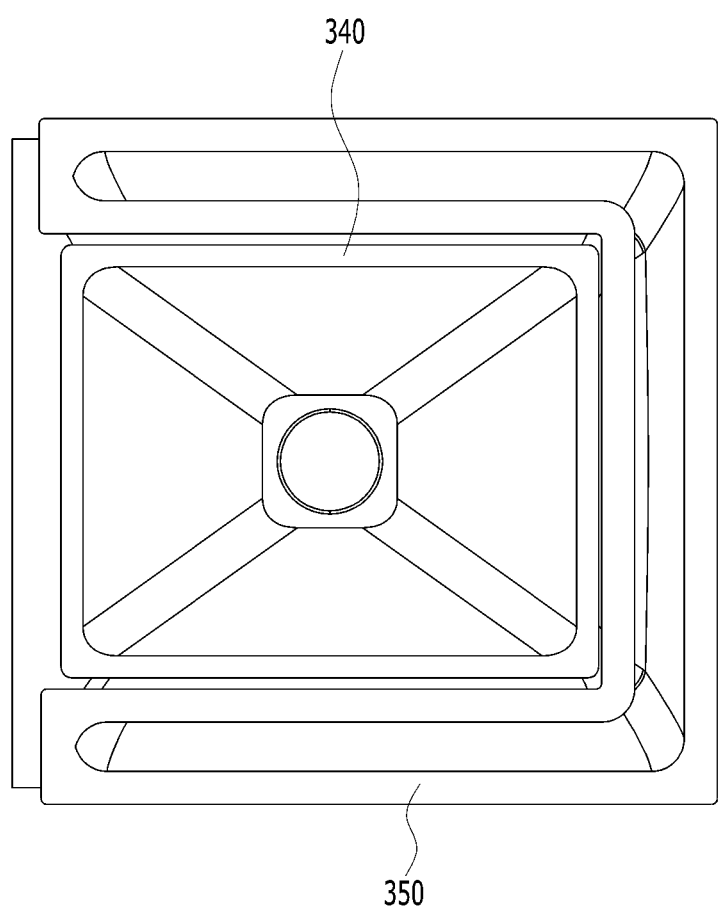
FIG. 8 is a top plan view showing an exhaust duct of the EFEM according to the first embodiment of the present invention.
Figure 9:
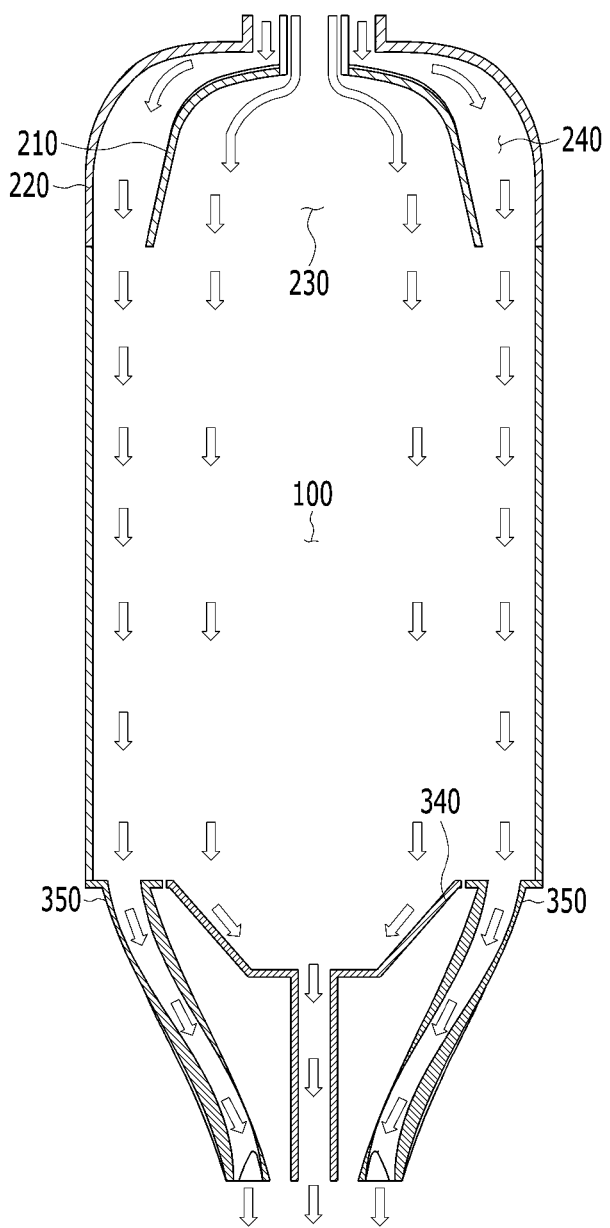
FIG. 9 is a vertical cross-sectional view showing gas flow of FIG. 3.

FIG. 1 is a plan view showing a process chamber connected to an EFEM according to a first embodiment of the present invention; FIG. 2 is an exploded view showing the EFEM according to the first embodiment of the present invention; FIG. 3 is a perspective view showing the EFEM according to the first embodiment of the present invention; FIG. 4 is an exploded view showing a delivery unit of the EFEM according to the first embodiment of the present invention; FIG. 5A is a top plan view showing the delivery unit of the EFEM according to the first embodiment of the present invention; FIG. 5B is a bottom plan view showing the delivery unit of the EFEM according to the first embodiment of the present invention; FIG. 6 is a plan view showing an flow control plate of the EFEM according to the first embodiment of the present invention; FIG. 7 is an exploded view showing an exhaust unit of the EFEM according to the first embodiment of the present invention; FIG. 8 is a top plan view showing an exhaust duct of the EFEM according to the first embodiment of the present invention; and FIG. 9 is a vertical cross-sectional view showing gas flow of FIG. 3.

The EFEM 10 according to the first embodiment of the present invention includes a wafer transfer chamber 100 in which wafer transfer is conducted between a wafer storage device 30 and a process equipment 20, a delivery unit 200 for delivering gas into the wafer transfer chamber 100, and an exhaust unit 300 for exhausting the gas from the wafer transfer chamber 100.

The gas in the EFEM 10 denotes to all gases in the EFEM 10 including inert gas that will be described. The inert gas denotes gas such as nitrogen, argon, etc.

As described in FIG. 1, a plurality of wafer storage devices 30 is arranged in connection to a front surface of the EFEM 10.

Each of the wafer storage devices 30 includes a front-opening unified pod (FOUP) 31 storing a wafer and a load port on which the FOUP 31 is coupled and loaded.

The FOUP 31 is opened at a side thereof and a plurality of wafers is received through the open side and stored in a vertical arrangement in the FOUP 31. Accordingly, when the wafers are transferred during each process in a wafer manufacturing process, the wafers can be easily transferred by the FOUP 31.

The FOUP 31 is coupled to and loaded on the load port. Accordingly, when the load port is installed on the front surface of the EFEM 10, the open side of the FOUP 31 communicates with a front wall opening formed in a front of the wafer transfer chamber 100, whereby the FOUP 31 and the wafer transfer chamber 100 are connected and communicate with each other.

When the FOUP 31 and the load port are coupled to each other, gas is supplied into the FOUP 31 through a gas delivery unit of the load port, whereby cleanliness of the wafers stored in the FOUP 31 can be managed separately.

The process equipment 20 where the wafers are processed is connected to a rear surface of the EFEM 10. In this case, a load lock chamber 21 of the process equipment 20 communicates with a rear wall opening formed in a rear wall of the wafer transfer chamber 100, whereby the process equipment 20 is connected to the rear surface of the EFEM 10.

A plurality of process equipment 20 may be connected to the rear surface of the EFEM 10, and the process equipment 20 may be configured in various ways.

For example, the process equipment 20 is configured such that a process equipment transfer chamber 22 is installed adjacent to the load lock chamber 21, and a plurality of process units 23 is installed adjacent to the process equipment transfer chamber 22, the plurality of process units 23 processing wafers.

A load lock chamber door 21a may be provided between the load lock chamber 21 and the rear wall of the wafer transfer chamber 100. By opening or closing the load lock chamber door 21a, the wafer transfer chamber 100 and the load lock chamber 21 communicate with or block each other.

A process equipment transfer chamber door 22a may be installed between the process equipment transfer chamber 22 and each of the process units 23. By opening or closing the process equipment transfer chamber door 22a, the process equipment transfer chamber 22 and the plurality of process units 23 communicate with or block each other.

The process equipment transfer chamber 22 may be provided with a process equipment transport device 24 such that the wafer is transferred between the load lock chamber 21 and the plurality of the process units 23 by using the process equipment transport device 24.

The wafer transfer chamber 100 serves to provide a space in which the wafer is transferred between the wafer storage device 30 connected to the front surface of the EFEM 10 and the process equipment 20 connected to the rear surface of the EFEM 10.

A transport device 110 installed in the wafer transfer chamber 100 transfers the wafer.

As shown in FIG. 2, the delivery unit 200 is disposed on the wafer transfer chamber 100.

An exhaust plate 310 of the exhaust unit 300 and an installation plate 111 on which the transport device 110 is installed are disposed under the wafer transfer chamber 100, that is, the bottom of the wafer transfer chamber 100. Accordingly, a bottom surface of the wafer transfer chamber 100 is configured by the exhaust plate 310 and the installation plate 111.

The wafer transfer chamber 100 is provided with a plurality of walls provided as a circumferential surface of the wafer transfer chamber 100. An opening is provided in one of the walls to which the wafer storage device 30, the process equipment 20, or a fume removal device is connected.

Hereinafter, a case where the plurality of walls provided as the circumferential surface of the wafer transfer chamber 100 includes the front wall, the rear wall, a left wall, and a right wall will be representatively described.

The front wall is provided at a front of the wafer transfer chamber 100, the rear wall is provided at a rear surface of the wafer transfer chamber 100, and the left and the right walls are respectively provided at left and right surfaces of the wafer transfer chamber 100.

The wafer transfer chamber 100 is configured such that the circumferential surface thereof is formed by the front wall, the rear wall, the left wall, and the right wall, which are described above, and the bottom surface thereof is formed by the exhaust plate 310.

The front wall is provided with the front wall opening connected with the FOUP 31 of the wafer storage device 30, and the rear wall is provided with the rear wall opening connected to the load lock chamber 21 of the process equipment 20.

Furthermore, the left wall and the right wall are provided with a left wall opening and a right wall opening, respectively.

At least one of the wafer storage device 30, the process equipment 20, and a separate fume removal device for removing fumes on wafers may be connected to the left wall opening or the right wall opening.

In addition, a left wall door and a right wall door may be respectively installed on the left wall and the right wall to open and close the left wall opening and the right wall opening. In this case, a pair of left wall doors and a pair of right wall doors may be provided such that both doors of the left wall doors and the right wall doors are opened and closed to open and close the left wall opening and the right wall opening.

As described above, the wafer transfer chamber 100 is provided with the front wall, the rear wall, the left wall, and the right wall, thereby having a structure in which the circumferential surface thereof substantially closed.

The delivery unit 200 is disposed on the wafer transfer chamber 100 and serves to deliver gas supplied from an external gas supply unit to a lower portion of the wafer transfer chamber 100, and thus delivering gas to the wafer transfer chamber 100, thereby generating downflow.

As shown in FIG. 4, the delivery unit 200 is provided with a delivery region, through which gas is delivered to the wafer transfer chamber 100, at a bottom surface thereof. In addition, the delivery unit 200 is provided with a supply tube 250 for supplying gas at an upper surface thereof.

The delivery unit 200 is configured with a first delivery unit 210 and a second delivery unit 220.

As shown in FIGS. 4 and 5, the delivery unit 200 is provided with a center delivery region 230 and a peripheral delivery region 240 at the bottom surface thereof.

The first and second delivery units 210 and 220 may have dome shapes. That is, the delivery unit 200 has the dome shape toward a center point thereof, where the supply tube 250 is provided.

The first delivery unit 210 and the second delivery unit 220 are configured in a same shape, but the first delivery unit 210 is smaller than the second delivery unit 220.

The first delivery unit 210 is inserted into the second delivery unit 220 while an upper surface of the first delivery unit 210, which is an outer surface of the first delivery unit 210, faces a lower surface of the second delivery unit 220, which is an inner surface of the second delivery unit 220.

The second delivery unit 220 is provided with a space where the first delivery unit 210 is inserted, and the first delivery unit 210 is inserted into the space of the second delivery unit 220 while keeping a constant distance with the second delivery unit 220.

That is, the outer surface of the first delivery unit 210 does not come into contact with inner surface of the second delivery unit 220 while the first delivery unit 210 is inserted into the second delivery unit 220.

The first delivery unit 210 and the second delivery unit 220 are respectively provided with a first supply tube 251 and a second supply tube 252 through which external gas is supplied, at each upper surface thereof.

As shown in FIG. 5B, the first supply tube 251 is inserted into the second supply tube 252 integrally with the first delivery unit 210. Here, a size of the first supply tube 251 is configured to be smaller than a size of the second supply tube 252, that is, a radius of the first supply tube 251 is configured to be smaller than a radius of the second supply tube 252. In addition, the radius of the first supply tube 251 is configured such that an outer surface of the first supply tube 251 does not come into contact with an inner surface of the second supply tube 252.

The external gas supplied from an external supply unit is delivered through the first supply tube 251 and the second supply tube 252 separately, and delivered to the center delivery region 230 and the peripheral delivery region 240 respectively.

Gas supplied to the first delivery unit 210 through the first supply tube 251 is delivered to the center delivery region 230, and gas supplied to the second delivery unit 220 through the second supply tube 252 is delivered into the wafer transfer chamber 100 through the peripheral delivery region 240.

The gas supplied through second supply tube 252 is delivered by flowing into a space between the first delivery unit 210 and the second delivery unit 220. That is, the gas flows along the upper surface of the first delivery unit 210 and is delivered to the peripheral delivery region 240.

The first delivery unit 210 and the second delivery unit 220 guide gas to the center delivery region 230 and the peripheral delivery region 240 respectively by respective controllers.

The center delivery region 230 guides gas to a center region of an inside of the wafer transfer chamber 100. That is, gas is delivered to a workspace of the transport device 110, which is provided at the center region of the inside of the wafer transfer chamber 100, whereby fumes introduced into the wafer transfer chamber 100 are removed by the gas.

The peripheral delivery region 240 is provided around the center delivery region 230 of the delivery unit 200, and generates downflow along a peripheral region of the wafer transfer chamber 100 of the EFEM 10, which is the front wall, the rear wall, the left wall, and the right wall of the wafer transfer chamber 100.

A filter (not shown) is disposed at a lower portion of the delivery unit 200 and filters foreign substances contained in gas delivered through the delivery unit. In this case, a HEPA filter may be used as the filter.

The delivery unit 200 is provided with a flow control plate 260 at the lower portion thereof, the flow control plate 260 controlling flow of gas delivered through the center delivery region 230 and the peripheral delivery region 240.

The flow control plate 260 is provided with a center flow control port 261 and a peripheral flow control port 262, and the peripheral flow control port 262 is provided with a flow control blade 263.

The center flow control port 261 guides gas delivered through the center delivery region 230 to flow to the center region of the inside of the wafer transfer chamber 100.

As the peripheral flow control port 262 is provided with the flow control blade 263, the peripheral flow control port 262 guides gas delivered to the peripheral delivery region 240 to flow to the peripheral region of the inside of the wafer transfer chamber 100.

As shown in FIGS. 7 to 9, the exhaust unit 300 is divided into a center exhaust unit 340 and a peripheral exhaust unit 350 provided around the center exhaust unit 340. Here, the center delivery region 230 and the peripheral delivery region 240 are disposed at positions corresponding to the center exhaust unit 340 and the peripheral exhaust unit 350 respectively. In addition, the center exhaust unit 340 and the peripheral exhaust unit 350 exhaust gas from the wafer transfer chamber 100 independently.

As shown in FIG. 7, the exhaust unit 300 includes the exhaust plate 310, a communicating plate 320, and an exhaust duct 330.

The exhaust unit 300 is disposed on the lower portion of the wafer transfer chamber 100 and exhausts gas from the wafer transfer chamber.

The gas exhausted by the exhaust unit 300 includes gas delivered by the delivery unit 200 and fumes remaining on wafers.

The exhaust plate 310 forms a part of the bottom surface of the wafer transfer chamber 100 and is provided with a plurality of exhaust holes 311.

The exhaust plate 310 is installed in an area where the transport device 110 is not installed on the wafer transfer chamber 100, that is, the exhaust plate 310 is installed in the area while surrounding the transport device 110.

The exhaust plate 310 is provided with the plurality of exhaust holes 311, and each of the exhaust holes 311 is provided with an inclined portion. A plurality of inclined portions communicates with respective upper portions of the plurality of exhaust holes 311.

The plurality of inclined portions are configured such that each diameter thereof gradually decreases toward the bottom of the exhaust plate 310 and has a streamlined shape being convex toward the bottom of the exhaust plate 310. Due to the structure of the inclined portion, gas inside the wafer transfer chamber 100 can be easily guided to flow to the exhaust hole 311, whereby harmful substances such as fumes, etc. are prevented from remaining in exhaust plate 310.

The exhaust plate 310 is provided with a partition wall 313, which partitions the plurality of exhaust holes 311 such that each exhaust hole is separated from another.

The partition wall 313 serves to guide downflow in the wafer transfer chamber 100, that is, gas in the wafer transfer chamber 100 is guided to the respective exhaust hole 311.

A plurality of partition walls 313 are provided among the plurality of exhaust holes 311 in front, rear, left, and right directions, respectively. Accordingly, the respective exhaust holes 311 are surrounded by the partition walls 313 whereby each of the exhaust holes 311 can be independently separated from another.

The communicating plate 320 is interposed between the exhaust plate 310 and the exhaust duct 330, and a plurality of communicating holes 321 penetrating the top and bottom surfaces of the communicating plate 320 are provided at positions corresponding to the plurality of exhaust holes 311.

The plurality of communicating holes 321 is provided in the same number as the plurality of exhaust holes 311 and allows communication of the plurality of exhaust holes 311 with the exhaust duct 330.

As the communicating plate 320 is interposed between the exhaust plate 310 and the exhaust duct 330, it is possible to prevent the exhaust hole 311 from being inserted into an exhaust duct hole of the exhaust duct 330, thus enabling the exhaust plate 310 to be easily disposed above the exhaust duct 330. In other words, the communicating plate 320 serves to assist an arrangement of the exhaust plate 310 and the exhaust duct 330.

The exhaust duct 330 is positioned at a lower portion of the communicating plate 320, and is provided with the exhaust duct hole at a center thereof.

The exhaust duct hole of the exhaust duct 330 communicates with the plurality of exhaust holes 311 and the plurality of communicating holes 321.

In this case, an opening area of the exhaust duct hole is configured to be larger than an opening area of the exhaust hole 311 such that one exhaust duct hole can communicate with the plurality of exhaust holes 311.

The exhaust duct hole may have a shape being sloped down toward a center of the exhaust duct 330, that is, being curved at the bottom of the wafer transfer chamber 100. Thus, gas having flowed into the exhaust duct hole can be exhausted easily.

The exhaust duct 330 is configured with the center exhaust unit 340 and the peripheral exhaust unit 350 that is provided around the center exhaust unit 340.

As shown in FIG. 8, the peripheral exhaust unit 350 may be configured to be a U-shape around the center exhaust unit 340. That is, the peripheral exhaust unit 350 is configured by surrounding three side surfaces of the center exhaust unit 340.

The center exhaust unit 340 serves to exhaust gas delivered from the center delivery region 230 and the peripheral exhaust unit 350 serves to exhaust gas delivered from the peripheral delivery region 240.

The exhaust unit 300 described above may be a plurality of exhaust units 300 according to use or size of the EFEM 10.

For example, the exhaust units 300 may be disposed at each opposite side of the installation plate 111. In this case, the installation plate 111 may be installed on a center of the wafer transfer chamber 100, and the exhaust units 300 may be installed on a left side and a right side of the installation plate 111 respectively.

In other words, an opening portion of the U-shaped peripheral exhaust unit 350 is disposed to face the installation plate 111 with respect to a central imaginary line of the installation plate 111.

As described above, gas is separately delivered to and exhausted from the central region and the peripheral region, in the wafer transfer chamber 100. That is, a pair consisting of the center delivery region 230 and the center exhaust unit 340, and a pair consisting of the peripheral delivery region 240 and the peripheral exhaust unit 350 are operated by different controllers respectively.

The center delivery region 230 and the peripheral delivery region 240 are operated by different controllers respectively, thereby serving different functions from each other in the wafer transfer chamber 100.

The center delivery region 230 delivers gas to the center region of the wafer transfer chamber 100, thus generating downflow, whereby fumes introduced into the wafer transfer chamber 100 are removed and thus cleanliness in the wafer transfer chamber is managed.

The peripheral delivery region 240 generates downflow along the peripheral region of the wafer transfer chamber 100, which is the front wall, the rear wall, the left wall, and the right wall of the wafer transfer chamber 100, whereby an air screen is generated, the air screen screening the inside of the wafer transfer chamber 100 from outside. In other words, the air screen is generated on the peripheral region of the wafer transfer chamber 100 due to the peripheral delivery region 240.

The air screen generated by the peripheral delivery region 240 screens the inside of the wafer transfer chamber 100 from the outside thereof, and serves to prevent outside water particles, dust, gas, etc. from being introduced. Accordingly, when a wafer is pulled out from the FOUP 31 and put into the wafer transfer chamber 100, primary purification is implemented by the air screen generated by the peripheral delivery region 240 and the wafer is implemented with secondary purification by the center delivery region 230, whereby desired cleanliness in the wafer transfer chamber 100 can be maintained.

In addition, air screen generated by the peripheral delivery region 240 prevents particles generated in the wafer transfer chamber 100 during wafer transfer from adhering to wall surfaces of the wafer transfer chamber 100, whereby the inside of the wafer transfer chamber 100 can be prevented from damage such as corrosion.

EFEM 10' According to a Second Embodiment of the Present Invention

Hereinafter, an EFEM 10' according to a second embodiment of the present invention will be described with reference to FIGS. 10 to 13.

Figure 10:
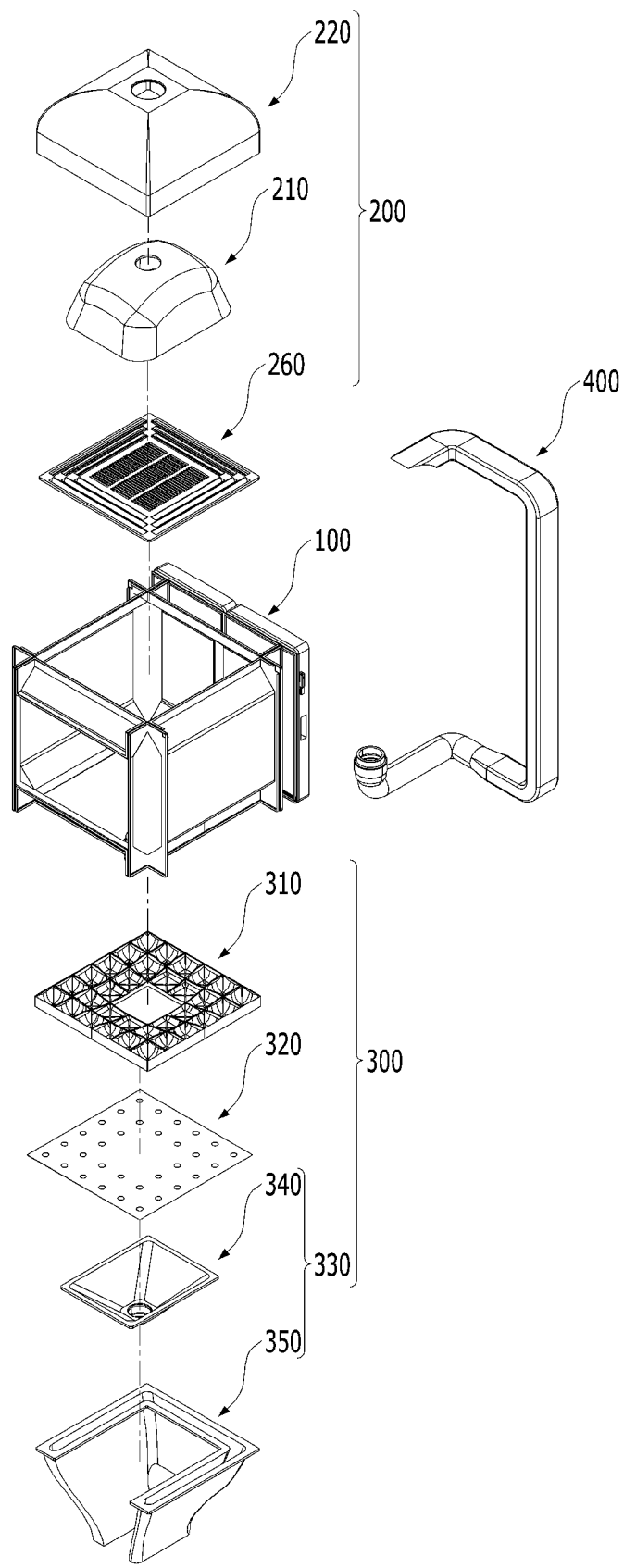
FIG. 10 is an exploded view showing an EFEM according to a second embodiment of the present invention.
Figure 11:
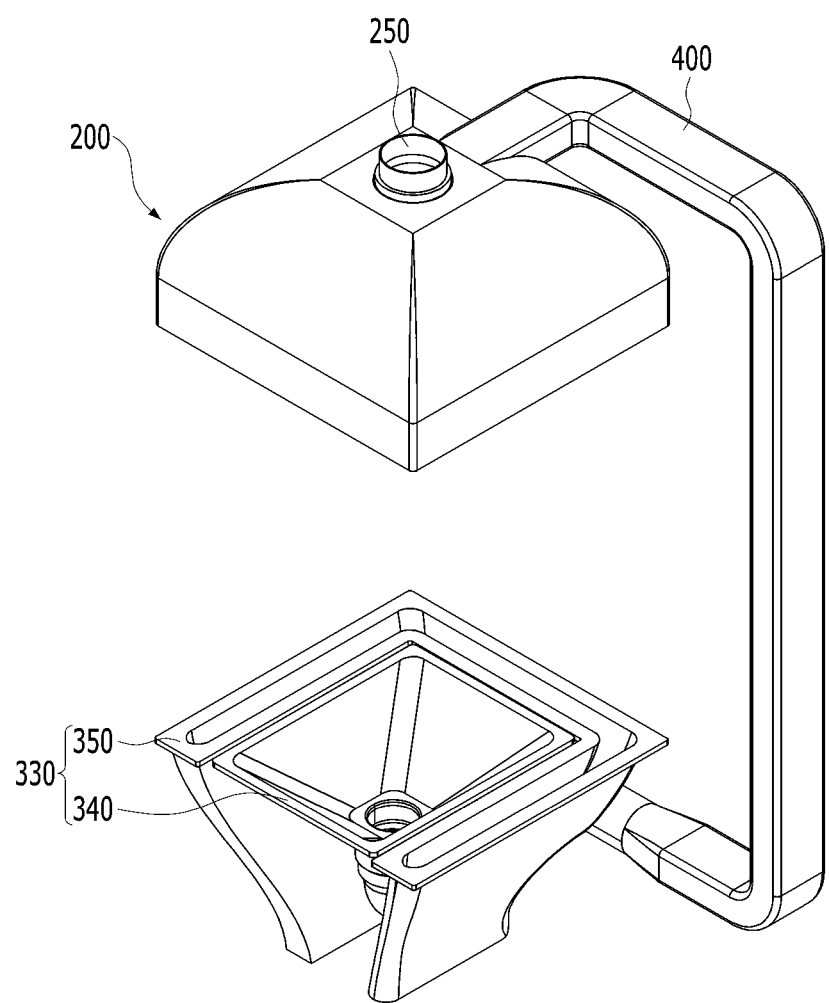
FIG. 11 is a perspective view showing a delivery unit, an exhaust duct, and a return line of the EFEM according to the second embodiment of the present invention.
Figure 12:
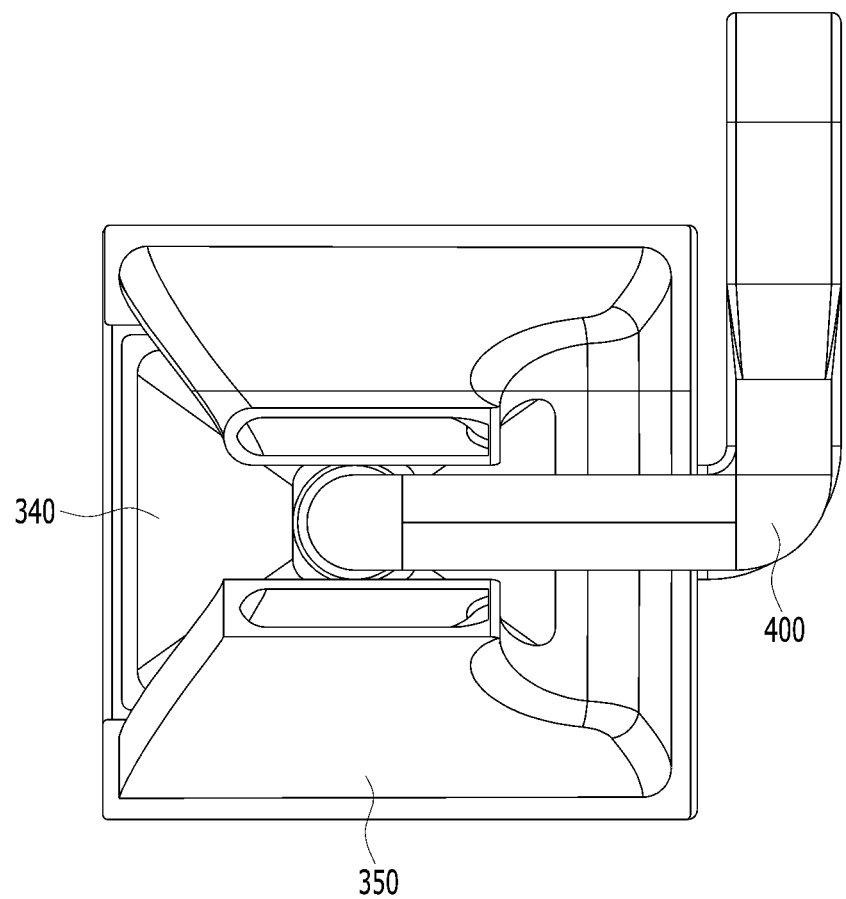
FIG. 12 is a bottom plan view showing the EFEM according to the second embodiment of the present invention.
Figure 13:
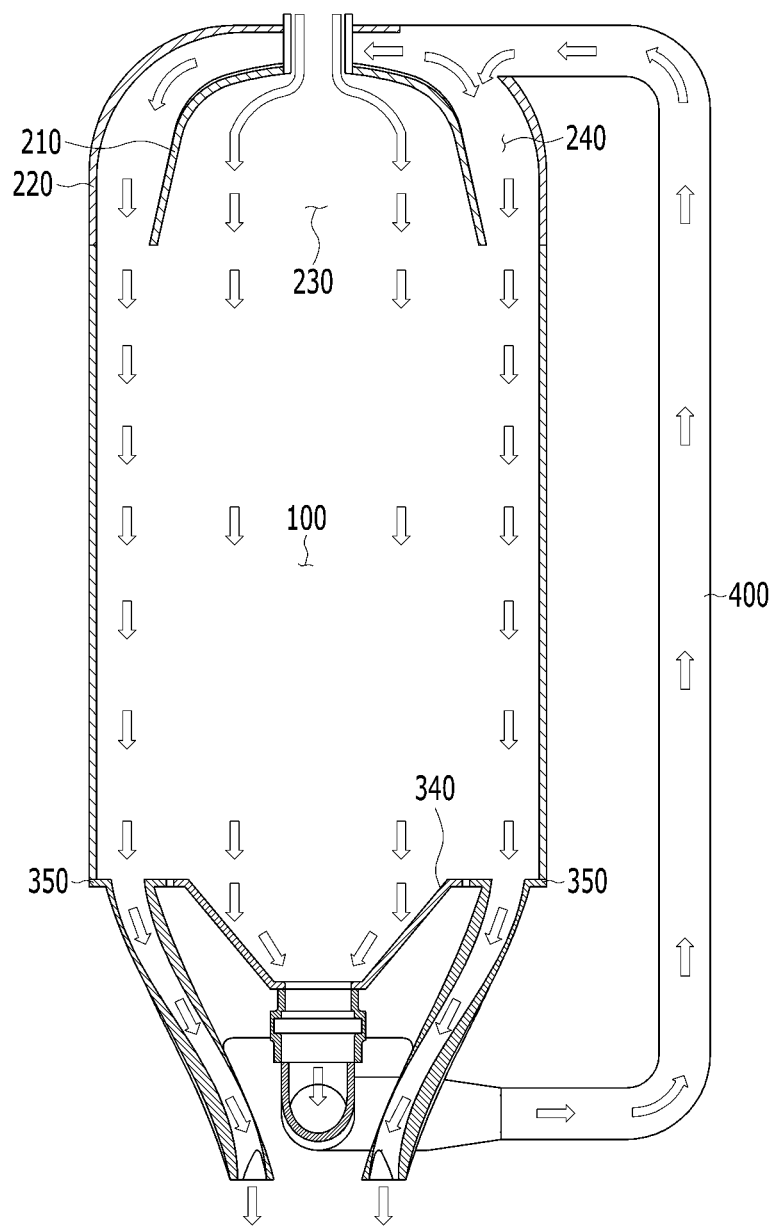
FIG. 13 is a vertical cross-sectional view showing gas flow of FIG. 11.

FIG. 10 is an exploded view showing an EFEM according to a second embodiment of the present invention; FIG. 11 is a perspective view showing a delivery unit, an exhaust duct, and a return line of the EFEM according to the second embodiment of the present invention; FIG. 12 is a bottom plan view showing the EFEM according to the second embodiment of the present invention; and FIG. 13 is a vertical cross-sectional view showing gas flow of FIG. 11.

Except that the EFEM 10' according to the second embodiment of the present invention has different shapes of a delivery unit 200, and a return line 400 for communicating the delivery unit 200 and an exhaust unit 300 with each other, the remaining elements and effects are the same as those of the EFEM 10 according to the first embodiment of the present invention.

Therefore, the same elements can be replaced with the above descriptions and thus repeated descriptions may be omitted.

The EFEM 10' according to the second embodiment of the present invention includes a wafer transfer chamber 100 in which wafer transfer is conducted between a wafer storage device and a process chamber, a delivery unit 200 disposed on the wafer transfer chamber 100 and delivering gas into the wafer transfer chamber 100, and an exhaust unit 300 disposed under the wafer transfer chamber 100 and exhausting the gas from the wafer transfer chamber 100. In addition, the delivery unit 200 is divided into a center delivery region 230 and a peripheral delivery region 240 provided around the center delivery region 230. The exhaust unit 300 is divided into a center exhaust unit 340 and a peripheral exhaust unit 350 provided around the center exhaust unit 340. The center delivery region 230 and the peripheral delivery region 240 are disposed at positions corresponding to the center exhaust unit 340 and the peripheral exhaust unit 350 respectively. Furthermore, the center exhaust unit 340 and the peripheral delivery region 240 communicate with each other by the return line 400 whereby gas exhausted from the center exhaust unit 340 is delivered to the wafer transfer chamber 100 through the peripheral delivery region 240.

As shown in FIG. 10, the delivery unit 200 is configured to have a width thereof tapering upward, and the delivery unit 200 is provided with the delivery region, through which gas is delivered into the wafer transfer chamber 100, at the bottom surface thereof. In addition, the delivery unit 200 is provided with a supply tube 250 for supplying gas at the upper surface thereof.

The delivery unit 200 is configured with a first delivery unit 210 and a second delivery unit 220.

The delivery unit 200 is provided with the center delivery region 230 and the peripheral delivery region 240 at a bottom surface thereof.

The delivery unit 200 may have a dome shape. That is, the delivery unit 200 has the dome shape toward a center point thereof, where the supply tube 250 is provided.

The first delivery unit 210 and the second delivery unit 220 are configured in a same shape, but the first delivery unit 210 is smaller than the second delivery unit 220.

The first delivery unit 210 is inserted into the second delivery unit 220 while an upper surface of the first delivery unit 210, which is an outer surface of the first delivery unit 210, faces a lower surface of the second delivery unit 220, which is an inner surface of the second delivery unit 220.

The second delivery unit 220 is provided with a space where the first delivery unit 210 is inserted, and the first delivery unit 210 is inserted into the space of the second delivery unit 220 while keeping a constant distance with the second delivery unit 220.

That is, the outer surface of the first delivery unit 210 does not come into contact with inner surface of the second delivery unit 220 while the first delivery unit 210 is inserted into the second delivery unit 220.

The first delivery unit 210 is provided with the supply tube 250 at an upper surface thereof, the supply tube 250 configured to protrude outside and introducing gas delivered through the center delivery region 230.

An upper surface of the second delivery unit 220 is connected to a second end of the return line 400 through which gas exhausted through the center exhaust unit 340 is introduced.

The center delivery region 230 and the peripheral delivery region 240 serve to exhaust gas supplied from an external gas supply unit downwardly. At this point, gas delivered through the peripheral delivery region 240 is supplied by the return line 400 that will be described below in detail, and the supplied gas is delivered to the peripheral delivery region 240, flowing along the upper surface of the first delivery unit 210 in the second delivery unit 220.

Gas supplied through the first and second delivery units 210 and 220 is delivered to the wafer transfer chamber 100 through the center delivery region 230 such that downflow is generated.

The exhaust unit 300 is configured with the center exhaust unit 340 and the peripheral exhaust unit 350, the center delivery region 230 and the peripheral delivery region 240 are disposed at positions corresponding to the center exhaust unit 340 and the peripheral exhaust unit 350 respectively.

As shown in FIG. 10, the return line 400 is configured to connect the center exhaust unit 340 and the second delivery unit 220 at a side surface of the EFEM 10'.

A first end of the return line 400 is connected to a lower surface of the center exhaust unit 340 and the second end thereof is connected to the upper surface of the second delivery unit 220.

Gas supplied through the supply tube 250 is delivered to the center delivery region 230 through the first delivery unit 210, and the gas delivered to the center delivery region 230 flows through the center region of the inside of the wafer transfer chamber 100 and is exhausted to the center exhaust unit 340, which is disposed at the position corresponding to the center delivery region 230.

At this point, the gas exhausted to the center exhaust unit 340 flows to the first end of the return line 400, which is connected to the lower surface of the center exhaust unit 340, that is, connected to the lower portion of the EFEM 10'.

The gas flowing into the return line 400 is introduced into the second delivery unit 220 through the second end of the return line 400, which is connected to the upper portion of the EFEM 10', that is, connected to the upper surface of the second delivery unit 220. The gas introduced into the second delivery unit 220 is delivered through the peripheral delivery region 240, flows to the peripheral region of the inside of the wafer transfer chamber 100, and is exhausted to outside the EFEM 10' through the peripheral exhaust unit 350 disposed at the position corresponding to the peripheral delivery region 240.

In other words, gas supplied to the EFEM 10' is circulated in an order of the first delivery unit 210, the center delivery region 230, the center exhaust unit 340, the return line 400, the second delivery unit 220, the peripheral delivery region 240, and the peripheral exhaust unit 350.

Gas delivered through the center delivery region 230 is delivered to the center region of the wafer transfer chamber 100 such that fumes on a wafer introduced into the wafer transfer chamber 100 are removed.

Gas delivered through the peripheral delivery region 240 serves as an air screen screening the inside of the wafer transfer chamber 100 from the outside thereof, and serves to remove particles on the wall surfaces of the EFEM 10' and prevent particles from adhering to the wall surfaces of the EFEM 10'.

Specifically, gas delivered through the center delivery region 230 serves to maintain desired cleanliness in the wafer transfer chamber 100, and then is recycled and circulated through the return line 400 and is delivered through the peripheral delivery region 240, serving as the air screen, removing particles, and preventing particles from adhering.

As described above, gas, which is delivered through the center delivery region 230 and exhausted through the center exhaust unit 340, is recycled and circulated through the return line 400 and is delivered to the peripheral delivery region 240, whereby the desired cleanliness of the wafer transfer chamber 100 can be maintained and an amount of gas used for conventional EFEMs can be reduced.

EFEM 10" According to a Third Embodiment of the Present Invention

Hereinafter, an EFEM 10" according to a third embodiment of the present invention will be described with reference to FIGS. 14 to 18.

Figure 14:
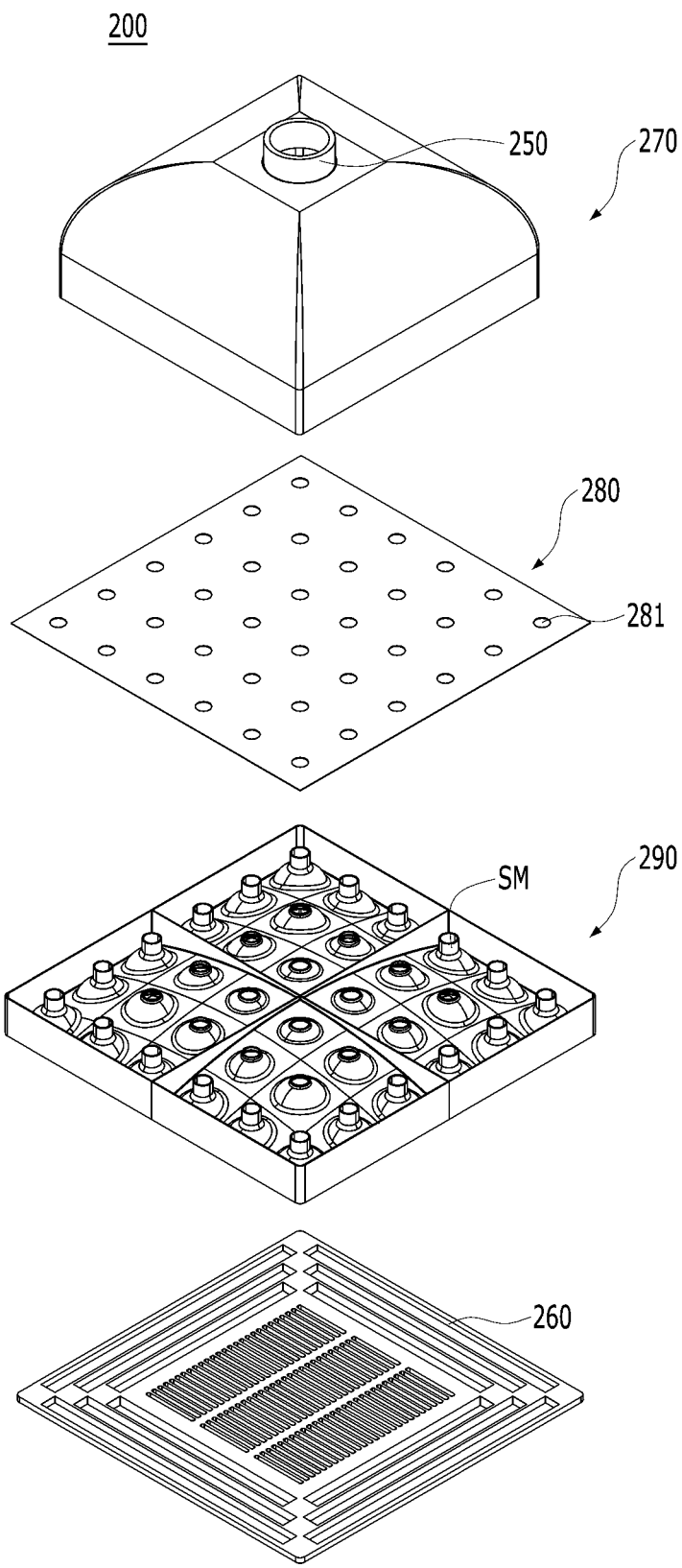
FIG. 14 is an exploded view showing a delivery unit of an EFEM according to a third embodiment of the present invention.
Figure 15:
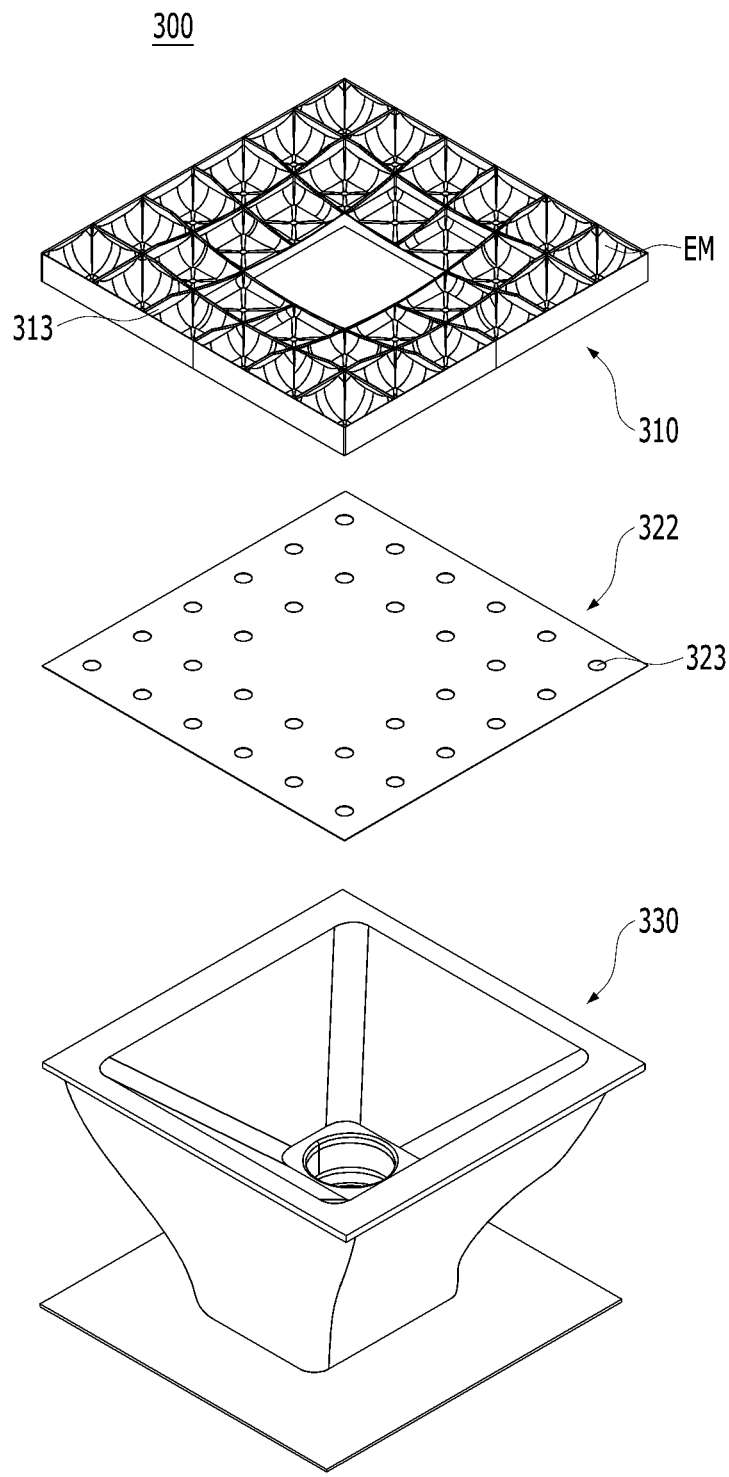
FIG. 15 is an exploded view showing an exhaust unit of the EFEM according to the third embodiment of the present invention.
Figure 16:
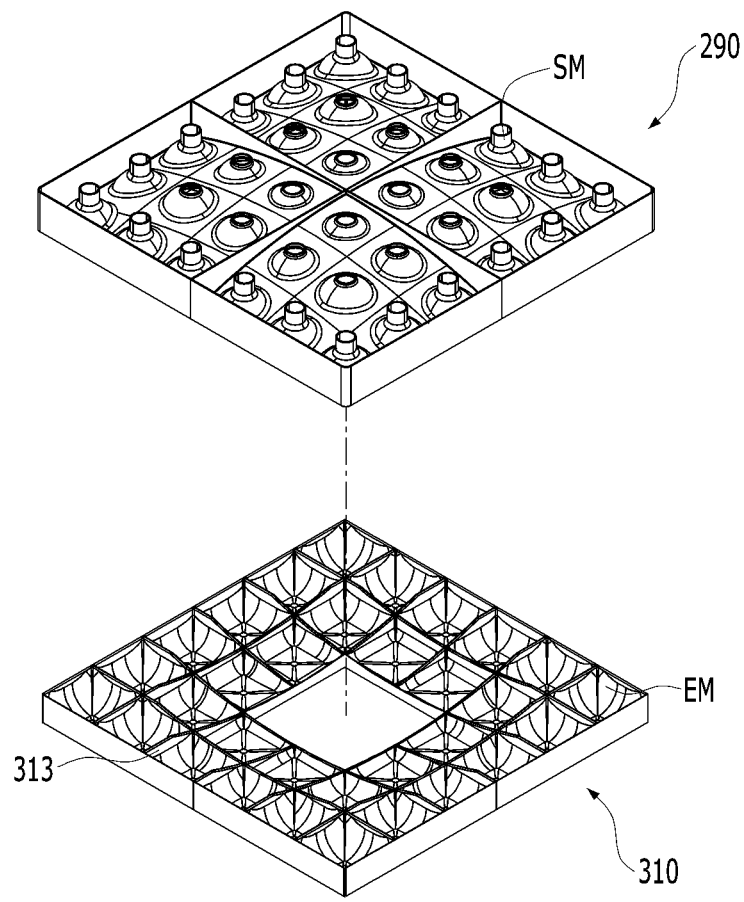
FIG. 16 is a perspective view showing a supply plate and a exhaust plate of the EFEM according to the third embodiment of the present invention.

FIG. 14 is an exploded view showing a delivery unit of an EFEM according to the third embodiment of the present invention; FIG. 15 is an exploded view showing an exhaust unit of the EFEM according to the third embodiment of the present invention; FIG. 16 is a perspective view showing a supply plate and a exhaust plate of the EFEM according to the third embodiment of the present invention; and FIG. 17 shows gas flows in the EFEM according to the third embodiment of the present invention.

Except that the EFEM 10" according to the third embodiment of the present invention has different shapes of a delivery unit 200 and an exhaust unit 30, the remaining elements are the same as those of the EFEM 10 according to the first embodiment of the present invention.

Therefore, the same elements can be replaced with the above descriptions and thus repeated descriptions may be omitted.

The EFEM 10" according to the third embodiment of the present invention includes a wafer transfer chamber 100 in which wafer transfer is conducted between a wafer storage device and a process chamber, a delivery unit 200 disposed on the wafer transfer chamber 100 and delivering gas into the wafer transfer chamber 100, and an exhaust unit 300 disposed under the wafer transfer chamber 100 and exhausting the gas from the wafer transfer chamber 100. In addition, the delivery unit 200 is provided with a plurality of supply modules (SM) and the plurality of supply modules (SM) can be controlled independently.

Meanwhile, the exhaust unit 300 is provided with a plurality of exhaust modules (EM) and the plurality of exhaust modules (EM) can be controlled independently.

Meanwhile, the delivery unit 200 and the exhaust unit 300 are provided with a plurality of supply modules (SM) and a plurality of exhaust modules (EM) respectively, and the plurality of supply modules (SM) and the plurality of exhaust modules (EM) can be controlled independently.

As shown in FIG. 14, the delivery unit 200 includes a supply duct 270, a supply plate 290, and a first communicating plate 280.

The supply duct 270 may have a dome shape. That is, the supply duct 270 has the dome shape toward a center point thereof where a supply tube 250 is provided.

The supply duct 270 is disposed above the first communicating plate 280. That is, the supply duct 270 is disposed at the top of the delivery unit 200, and the first communicating plate 280 and the supply plate 290 are sequentially disposed below the supply duct 270.

The supply duct 270 is provided with a supply duct hole at the center thereof.

The supply duct hole of the supply duct 270 communicates with the plurality of supply modules (SM) and a plurality of first communicates holes 281.

In this case, an opening area of the supply duct hole is configured to be larger than an opening area of the supply modules (SM) such that one supply duct hole can communicate with the plurality of supply modules (SM).

The first communicating plate 280 is interposed between the supply plate 290 and the supply duct 270. In other words, the supply duct 270 is disposed on the first communicating plate 280 and the supply plate is disposed under the first communicating plate 280.

The first communicating plate 280 is provided with the plurality of first communicating holes 281 at positions corresponding to the plurality of supply modules (SM), the first communicating holes 281 penetrating the top and bottom surfaces of the first communicating plate 280.

The plurality of first communicating holes 281 is provided in the same number as the plurality of supply modules (SM) and serve to communicate the plurality of supply modules (SM) with the supply duct 270.

As the first communicating plate 280 is interposed between the supply plate 290 and the supply duct 270, it is possible to prevent the supply modules (SM) of the supply duct 270 from inserting into the supply duct hole of the supply duct 270, thus enabling the supply plate 290 to be easily disposed under the supply duct 270. In other words, the first communicating plate 280 serves to assist an arrangement of the supply plate 290 and the supply duct 270.

The supply plate 290 is provided under the first communicating plate 280 and provided with the plurality of supply modules (SM). That is, the plurality of supply modules (SM) is provided to configure the supply plate 290.

Each of the supply modules (SM) is provided with an inclined portion. A plurality of inclined portions are configured such that each diameter thereof gradually decreases toward the top and has a streamlined shape being convex toward the top of the supply plate 290. Due to the structure of the inclined portion, gas introduced into the supply tube 250 can be easily guided to flow into the wafer transfer chamber 100.

The supply plate 290 is provided with a partition wall 313, which partitions the plurality of supply modules (SM).

A plurality of partition walls 313 is provided among the plurality of supply modules (SM) in front, rear, left, and right directions, respectively. Accordingly, each of the supply modules (SM) can be independently separated from another.

As shown in FIG. 15, the exhaust unit 300 includes an exhaust plate 310, a second communicating plate 322, and an exhaust duct 330.

The exhaust plate 310 is provided above the second communicating plate 322 and provided with the plurality of exhaust modules (EM). That is, the plurality of exhaust modules (EM) is provided to configure the exhaust plate 310.

A center region of the exhaust plate 310 is opened to be mounted with a transport device 110.

Each of the exhaust modules (EM) is provided with an inclined portion. A plurality of inclined portions are configured such that each diameter thereof gradually decreases toward the bottom and has a streamlined shape being convex toward the bottom of the exhaust plate. Due to the structure of the inclined portion, gas inside the wafer transfer chamber 100 can be easily guided to flow to the exhaust modules (EM).

The exhaust plate 310 is provided with a partition wall 313, which partitions the plurality of exhaust modules (EM).

A plurality of partition wall 313 is provided among the plurality of exhaust modules (EM) in front, rear, left, and right directions, respectively.

Accordingly, each of the exhaust modules (EM) can be independently separated from another.

The second communicating plate 322 is interposed between the exhaust plate 310 and the exhaust duct 330. In other words, the exhaust plate 310 is disposed on the second communicating plate 322 and the exhaust plate is disposed under the second communicating plate 322.

The second communicating plate 322 is provided with a plurality of second communicating holes 323 at positions corresponding to the plurality of exhaust modules (EM), the second communicating holes 323 penetrating the top and bottom surfaces of the second communicating plate 322.

The plurality of second communicating holes 323 are provided in the same number as the plurality of exhaust modules (EM) and serve to communicate the plurality of exhaust modules (EM) with the exhaust duct 330.

As the second communicating plate 322 is interposed between the exhaust plate 310 and the exhaust duct 330, it is possible to prevent the exhaust modules (EM) of the exhaust duct 330 from being inserted into an exhaust duct hole of the exhaust duct 330, thus enabling the exhaust plate 310 to be easily disposed on the exhaust duct 330. In other words, the second communicating plate 322 serves to assist an arrangement of the exhaust plate 310 and the exhaust duct 330.

The exhaust duct 330 is disposed under the second communicating plate 322. That is, the exhaust duct 330 is disposed at the bottom of the exhaust unit 300, and the second communicating plate 322 and the exhaust plate 310 are sequentially disposed on the exhaust duct 330.

The exhaust duct 330 is provided with the exhaust duct hole at the center thereof.

The exhaust duct hole of the exhaust duct 330 communicates with the plurality of exhaust modules (EM) and the plurality of second communicating holes 323.

In this case, an opening area of the exhaust duct hole is configured to be larger than an opening area of the exhaust modules (EM) such that one exhaust duct hole can communicate with the plurality of exhaust modules (EM).

Hereinbelow, gas flow, which may occur in the wafer transfer chamber 100 of the EFEM 10" according to the third embodiment of the present invention, will be described with reference to FIGS. 16 to 18.

As shown in FIG. 16, the supply plate 290 provided with the supply modules (SM) and the exhaust plate 310 provided with the exhaust modules (EM) are disposed at positions corresponding to each other.

The plurality of supply modules (SM) on the delivery unit 200 and the plurality of exhaust modules (EM) on the exhaust unit 300 can be controlled independently.

Each of the plurality of first and second communicating holes 281 and 323 is provided with an opening and closing unit (not shown), the plurality of first communicating hole 281 allowing communication of the first communicating plate 280 and the supply modules (SM) with each other and the second communicating hole 323 allowing communication of the second communicating plate 322 and the exhaust modules (EM) with each other.

Some or all of the first communicating holes 281 and the second communicating holes 323 are opened or closed by using the opening and closing unit such that it is possible to control the supply modules (SM) and the exhaust modules (EM). Accordingly, a flow rate of gas supplied into the wafer transfer chamber 100 can be controlled.

Figure 17A:
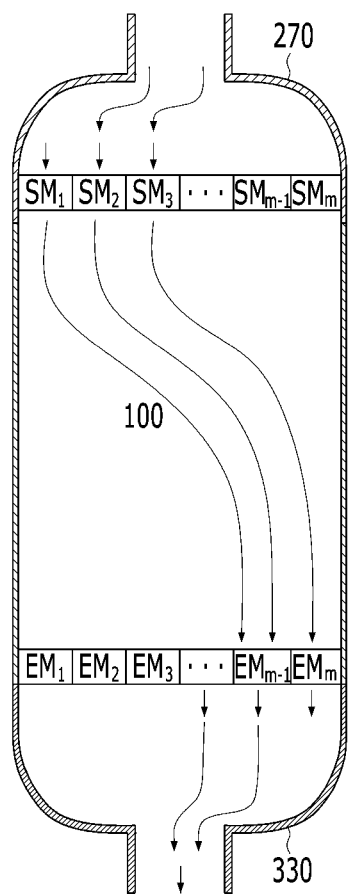
FIGS. 17A to 17C are views showing gas flow in the EFEMs according to the third embodiment of the present invention.

In detail, as shown in FIG. 17A, when some of the supply modules (SM1, SM2, and SM3) are opened and all the remaining modules are closed, gas supplied through the supply tube 250 is delivered to the wafer transfer chamber 100 through the opened supply modules (SM1, SM2, and SM3).

At this point, when some of the exhaust modules (EMn−1, EMn) are opened at the lower portion of the wafer transfer chamber 100, the gas delivered through the delivery unit 200 is introduced into the opened exhaust modules (EMn−1, EMn) and exhausted to outside the EFEM 10" through the exhaust duct 330.

On the other hand, a controller (not shown) may be provided to control a flow rate and a flow velocity of gas supplied to the supply modules (SM) and exhausted from the exhaust modules (EM), whereby the supply modules (SM) and the exhaust modules (EM) can be controlled independently.

For example, mass flow controller (MFC) may be used for the controller, but the present invention is not limited thereto.

When using the controller, a flow velocity of gas can be controlled, in addition to a flow rate of gas supplied into the EFEM 10".

Figure 17B:
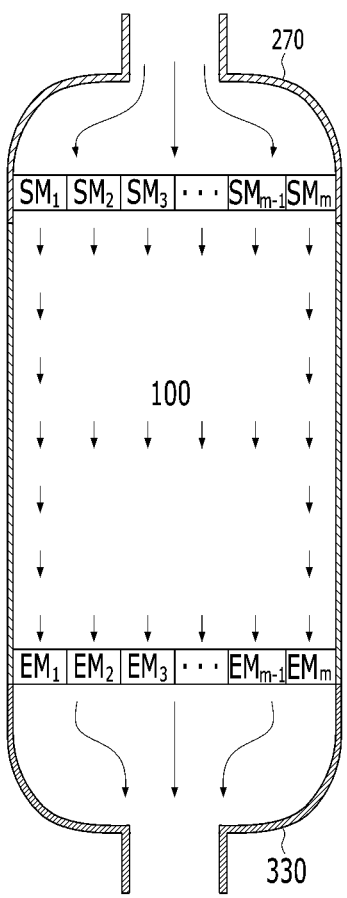
Figure 17C:
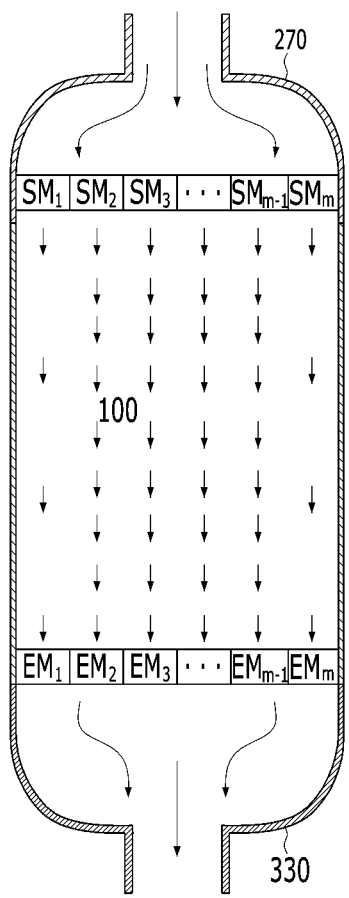

As shown in FIGS. 17B and 17C, various gas flows can be provided according to flow velocity of gas.

As shown in FIG. 17B, a peripheral portion of the supply plate 290, that is, supply modules (SM1 and SMm) may have a relatively fast flow velocity. On the other hand, as shown in FIG. 17C, a center portion of the supply plate 290, that is, supply modules (SM2, SM3, and SMm−1) may have a relatively fast flow velocity.

Accordingly, a flow rate and flow velocity of gas supplied into the wafer transfer chamber 100 can be controlled by independent controls of the supply modules (SM) and the exhaust modules (EM) whereby various gas flows supplied into the wafer transfer chamber 100 can be generated.

Therefore, an air screen effect that screens the inside of the wafer transfer chamber 100 from outside can be obtained and a gas flow velocity at the center portion of the wafer transfer chamber 100 can be increased, thereby more easily removing introduced fumes on a wafer.

In addition, by generating various gas flow, particles in the wafer transfer chamber 100 can be more easily removed whereby cleanliness in the wafer transfer chamber 100 can be improved.

As described above, the present invention has been described with reference to the preferred embodiments. However, those skilled in the art will appreciate that various modifications, additions and substitutions are possible, without departing from the scope and spirit of the invention as disclosed in the accompanying claims.

What is claimed is:

1. An equipment front end module (EFEM), the EFEM comprising:
   a wafer transfer chamber in which wafer transfer is conducted between a wafer storage device and a process chamber;
   a delivery unit disposed on the wafer transfer chamber; and
   an exhaust unit disposed under the wafer transfer chamber,
   wherein the delivery unit is divided into a center delivery region and a peripheral delivery region that is provided around the center delivery region,
   wherein the exhaust unit is divided into a center exhaust unit and a peripheral exhaust unit provided around the center exhaust unit,
   wherein the center delivery region and the peripheral delivery region are disposed at positions corresponding to the center exhaust unit and the peripheral exhaust unit, respectively,
   wherein gas introduced through a supply tube is delivered into the wafer transfer chamber through the center delivery region, and is exhausted from the center exhaust unit,
   wherein the center exhaust unit and the peripheral delivery region are communicated with each other by a return line whereby the gas exhausted from the center exhaust unit is delivered to the peripheral delivery region through the return line,
   wherein the gas delivered into the wafer transfer chamber through the peripheral delivery region is exhausted to outside of the EFEM through the peripheral exhaust unit, and
   wherein the center exhaust unit and the peripheral exhaust unit have spatially separated flow paths from each other.

* * * * *